United States Patent
Tsuda

(10) Patent No.: US 9,171,852 B2
(45) Date of Patent: Oct. 27, 2015

(54) NONVOLATILE SEMICONDUCTOR MEMORY DEVICE

(71) Applicant: Kabushiki Kaisha Toshiba, Minato-ku (JP)

(72) Inventor: Muneyuki Tsuda, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/197,526

(22) Filed: Mar. 5, 2014

(65) Prior Publication Data

US 2015/0041877 A1 Feb. 12, 2015

(30) Foreign Application Priority Data

Aug. 6, 2013 (JP) .................................. 2013-163386

(51) Int. Cl.
*H01L 21/8222* (2006.01)
*H01L 27/115* (2006.01)

(52) U.S. Cl.
CPC ................................ *H01L 27/11521* (2013.01)

(58) Field of Classification Search
CPC ............. H01L 21/76264; H01L 21/76289; H01L 21/764; H01L 21/7682; H01L 27/115; H01L 29/0649; H01L 29/4991; H01L 2924/1451; H01L 2924/14511; H01L 2221/1042

USPC .................. 438/257–267, 421; 257/314–324
See application file for complete search history.

(56) References Cited

U.S. PATENT DOCUMENTS

| 2012/0178235 A1* | 7/2012 | Pachamuthu et al. ......... 438/421 |
| 2012/0217569 A1* | 8/2012 | Kinoshita et al. ............. 257/321 |
| 2013/0181278 A1* | 7/2013 | Lee et al. ...................... 257/324 |

FOREIGN PATENT DOCUMENTS

JP   2012-109466   6/2012

\* cited by examiner

*Primary Examiner* — Brook Kebede
(74) *Attorney, Agent, or Firm* — Oblon, McClelland, Maier & Neustadt, L.L.P.

(57) ABSTRACT

According to one embodiment, a nonvolatile semiconductor memory device includes: a plurality of memory cells, each of the memory cells including a tunneling insulating film provided on a substrate including silicon, a floating gate provided on the tunneling insulating film, an inter-gate insulating film provided on the floating gate, and a control gate provided on the inter-gate insulating film; and an element separation trench provided between the plurality of memory cells, the element separation trench having a gap in an interior of the element separation trench. The inter-gate insulating film is provided also above the element separation trench. An upper end of the gap is provided in an interior of the inter-gate insulating film provided above the element separation trench.

20 Claims, 1 Drawing Sheet

NONVOLATILE SEMICONDUCTOR MEMORY DEVICE

CROSS-REFERENCE TO RELATED APPLICATIONS

This application is based upon and claims the benefit of priority from Japanese Patent Application No.2013-163386, filed on Aug. 6, 2013; the entire contents of which are incorporated herein by reference.

FIELD

Embodiments described herein relate generally to a nonvolatile semiconductor memory device.

BACKGROUND

A memory cell provided in a nonvolatile semiconductor memory device such as NAND flash memory, etc., has a stacked gate structure in which a floating gate and a control gate are stacked with an inter-gate insulating film interposed.

Here, the distance between adjacent floating gates is becoming shorter with downscaling. The electrical interference (e.g., the capacitive coupling, etc.) between the adjacent floating gates increases as the distance between the adjacent floating gates decreases.

Therefore, for example, the voltage of the floating gate during programming decreases; and there is a risk that programming defects, etc., may occur.

Therefore, technology has been proposed in which a gap is provided in the interior of the element separation trench between the adjacent memory cells.

By providing the gap, the programming characteristics can be improved because the electrical interference between the adjacent floating gates can be reduced.

However, as downscaling progresses, the electrical interference between the adjacent floating gates is predicted to increase further. Therefore, further improvement of the programming characteristics is desirable.

DETAILED DESCRIPTION

Figure 1:
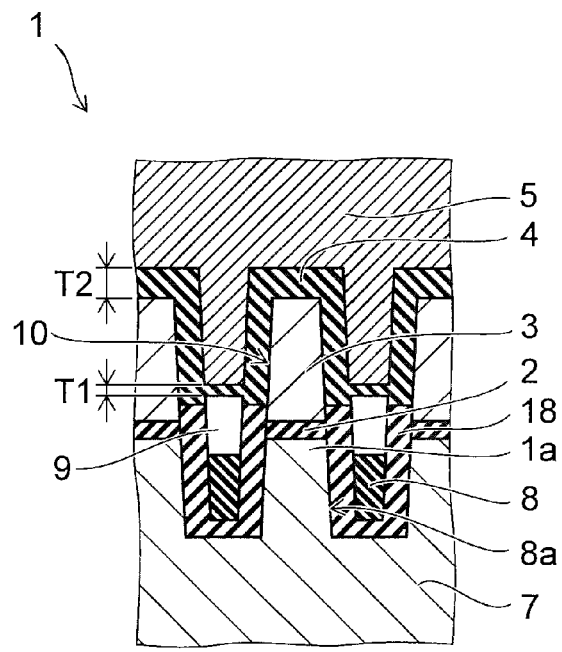
FIG. 1 is a schematic partial cross-sectional view showing a nonvolatile semiconductor memory device according to an embodiment.

In general, according to one embodiment, a nonvolatile semiconductor memory device includes: a plurality of memory cells, each of the memory cells including a tunneling insulating film provided on a substrate including silicon, a floating gate provided on the tunneling insulating film, an inter-gate insulating film provided on the floating gate, and a control gate provided on the inter-gate insulating film; and an element separation trench provided between the plurality of memory cells, the element separation trench having a gap in an interior of the element separation trench, the inter-gate insulating film being provided also above the element separation trench, an upper end of the gap being provided in an interior of the inter-gate insulating film provided above the element separation trench.

Embodiments will now be described with reference to the drawings. Similar components in the drawings are marked with like reference numerals, and a detailed description is omitted as appropriate.

FIG. 1 is a schematic partial cross-sectional view showing a nonvolatile semiconductor memory device 1 according to the embodiment.

The nonvolatile semiconductor memory device 1 shown in FIG. 1 is NAND flash memory.

In FIG. 1, mainly the portion of a memory cell 10 is shown; and known word lines, bit lines, inter-layer insulating films, protective films, contacts, peripheral circuit units, etc., that are provided in the nonvolatile semiconductor memory device 1 are not shown.

Because FIG. 1 is a drawing showing a cross section in the word line direction (the channel width direction), known source/drain regions, channel regions, etc., also are not shown.

As shown in FIG. 1, a tunneling insulating film 2, a floating gate 3, an inter-gate insulating film 4, and a control gate 5 are stacked in this order in the memory cell 10 of the nonvolatile semiconductor memory device 1.

The memory cell 10 is multiply provided on an active area (an element formation region; an active region) 1a of a substrate 7 including silicon. An element separation trench 8a is provided around the periphery of the memory cell 10.

The tunneling insulating film 2 is provided on the substrate 7. In such a case, the tunneling insulating film 2 is provided on the active area 1a. The tunneling insulating film 2 may be, for example, a silicon oxide film, a silicon oxynitride film, etc., having a thickness of about 3 nm to 15 nm.

The floating gate 3 is provided on the tunneling insulating film 2. The floating gate 3 may be, for example, a polysilicon film, etc., having a thickness of about 10 nm to 500 nm. In such a case, to obtain conductivity, for example, phosphorus, arsenic, boron, etc., may be doped with a concentration of about $10^{18}$ atoms/cm$^3$ to $10^{21}$ atoms/cm$^3$.

The inter-gate insulating film 4 is provided on the upper surface and side surface of the floating gate 3.

Also, the inter-gate insulating film 4 is provided above the element separation trench 8a.

The inter-gate insulating film 4 may be, for example, an insulating film having a thickness of about 5 nm to 30 nm. In such a case, the inter-gate insulating film 4 may be, for example, a silicon oxide film, a silicon oxynitride film, etc. Also, the inter-gate insulating film 4 may be, for example, a stacked film such as a silicon oxide film/silicon nitride film/silicon oxide film (ONO film).

The control gate 5 is provided on the inter-gate insulating film 4. The control gate 5 is provided between adjacent floating gates 3. The control gate 5 extends in the word line direction. The control gate 5 is included as a portion of the word line.

The control gate 5 may be, for example, a polysilicon film, etc., having a thickness of about 10 nm to 500 nm. In such a case, to obtain conductivity, for example, phosphorus, arsenic, boron, etc., may be doped with a concentration of about $10^{18}$ atoms/cm$^3$ to $10^{21}$ atoms/cm$^3$.

Or, the control gate 5 may have a stacked structure in which a silicide film and a polysilicon film are stacked. The stacked film in which the silicide film and the polysilicon film are stacked may be formed, for example, as follows. First, a metal film of W, Ni, Mo, Ti, Co, etc., is formed on a polysilicon film. Then, a silicide film is formed on the polysilicon film by performing heat treatment. Thus, the stacked film in which the silicide film and the polysilicon film are stacked can be formed.

An element-separating insulating film 8 is provided in the interior of the element separation trench 8a. The element-separating insulating film 8 is provided below a gap 9.

The element-separating insulating film 8 may be formed by, for example, filling an insulator such as silicon oxide, etc., into the interior of the element separation trench 8a.

A protective film 18 may be provided at the inner wall of the element separation trench 8a.

The protective film 18 is provided such that the impurities included in the element-separating insulating film 8 do not affect the substrate 7, etc. To this end, the protective film 18 is formed from, for example, an insulator (e.g., silicon oxide, etc.) having a purity that is higher than that of the element-separating insulating film 8.

However, the protective film 18 is not always necessary and may be provided as necessary.

The gap 9 is provided in the interior of the element separation trench 8a.

As shown in FIG. 1, the gap 9 is provided between the inter-gate insulating film 4 and the element-separating insulating film 8. The gap 9 may be made by, for example, removing a portion of the element-separating insulating film 8 provided in the interior of the element separation trench 8a.

The gap 9 may be provided continuously along the element separation trench 8a.

The fringing capacitance between the control gate 5 and the substrate 7 can be reduced by the gap 9 being provided continuously along the element separation trench 8a.

The position of the lower end of the gap 9 (the upper end of the element-separating insulating film 8) may be lower than the position of the lower end of the floating gate 3 (the upper end of the tunneling insulating film 2).

For example, air exists in the interior of the gap 9.

By providing the gap 9 (e.g., air having a relative dielectric constant of 1) in the interior of the element separation trench 8a, the electrostatic capacitance between the adjacent floating gates 3 can be lower than that of the case where the interior of the element separation trench 8a is filled with an insulator (e.g., silicon oxide having a relative dielectric constant of 3.9).

Therefore, the value of the coupling ratio can be increased because the electrical interference due to the electrostatic capacitance between the adjacent floating gates 3 can be reduced.

Here, the coupling ratio can be represented by C2/(C1+C2+C3), where C1 is the electrostatic capacitance between the substrate 7 and the floating gate 3, C2 is the electrostatic capacitance between the floating gate 3 and the control gate 5, and C3 is the electrostatic capacitance between the adjacent floating gates 3.

The voltage that is applied to the control gate 5 can be reduced as the value of the coupling ratio is increased. Therefore, the programming characteristics can be improved.

In other words, by providing the gap 9, the value of the coupling ratio can be increased; and even the programming characteristics can be improved.

However, as downscaling progresses, the electrostatic capacitance C3 between the adjacent floating gates 3 increases because the distance between the adjacent floating gates 3 becomes even shorter.

As a result, as downscaling progresses, there is a risk that the programming characteristics may degrade because the value of the coupling ratio decreases.

Therefore, in the nonvolatile semiconductor memory device 1 according to the embodiment, the upper end of the gap 9 is provided in the interior of the inter-gate insulating film 4 provided above the element separation trench 8a.

In other words, the thickness of the inter-gate insulating film 4 above the gap 9 is, for example, thinner than the thickness of the inter-gate insulating film 4 above the floating gate 3.

Thereby, the distance from the lower end of the floating gate 3 to the upper end of the gap 9 can be longer. In other words, the gap 9 provided between the adjacent floating gates 3 can be larger.

Therefore, the value of the coupling ratio can be increased and even the programming characteristics can be improved because the electrostatic capacitance C3 between the adjacent floating gates 3 can be reduced.

Here, in the case where the position of the upper end of the gap 9 is high, the electrostatic capacitance C2 between the floating gate 3 and the control gate 5 decreases because the opposing surface area between the floating gate 3 and the control gate 5 decreases. In the case where the electrostatic capacitance C2 decreases, there is a risk that the programming characteristics may degrade because the value of the coupling ratio decreases.

In other words, if the position of the upper end of the gap 9 is set to be high, the value of the coupling ratio can be increased due to the decrease of the electrostatic capacitance C3. However, on the other hand, the value of the coupling ratio decreases due to the decrease of the electrostatic capacitance C2.

Therefore, in the nonvolatile semiconductor memory device 1 according to the embodiment, the upper end of the gap 9 is provided in the interior of the inter-gate insulating film 4. In other words, the gap 9 does not pierce the inter-gate insulating film 4 provided above the element separation trench 8a. Therefore, the inter-gate insulating film 4 remains above the element separation trench 8a.

By the inter-gate insulating film 4 remaining above the element separation trench 8a, the decrease of the opposing surface area between the floating gate 3 and the control gate 5 can be suppressed. Therefore, the decrease of the electrostatic capacitance C2 between the floating gate 3 and the control gate 5 can be suppressed. If the decrease of the electrostatic capacitance C2 can be suppressed, the decrease of the value of the coupling ratio can be suppressed.

Figure 2:
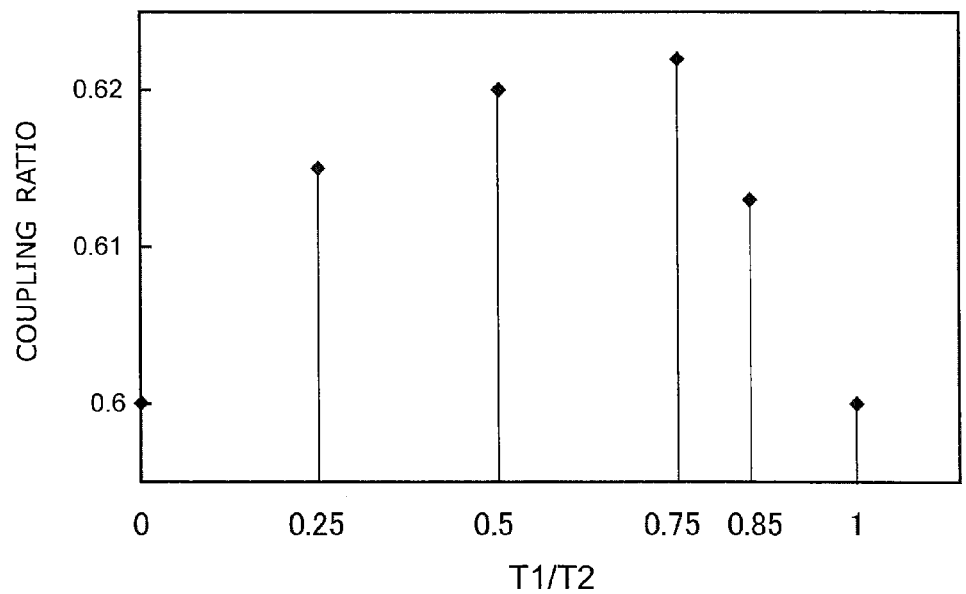
FIG. 2 is a graph showing a relationship between a value of a coupling ratio and a proportion of a thickness dimension of a inter-gate insulating film above a gap.

FIG. 2 is a graph showing the relationship between the value of the coupling ratio and the proportion of the thickness dimension of the inter-gate insulating film 4 above the gap 9. In FIG. 2, T1 is the thickness dimension of the inter-gate insulating film 4 above the gap 9. T2 is the thickness dimension of the inter-gate insulating film 4 above the floating gate 3.

FIG. 2 shows the relationship between the value of the coupling ratio and T1/T2 determined by performing a device simulation for NAND flash memory having a gate length of 19 nm.

As seen from FIG. 2, when 0<T1/T2<1, the value of the coupling ratio can be increased and even the programming characteristics can be improved.

Also, if T1/T2 is large, as described above, the value of the coupling ratio can be increased due to the decrease of the electrostatic capacitance C3. However, on the other hand, the value of the coupling ratio decreases due to the decrease of the electrostatic capacitance C2.

In such a case, the value of the coupling ratio is a maximum and even the programming characteristics are most favorable when T1/T2 is 0.75.

In such a case, the thickness dimension of the inter-gate insulating film 4 may fluctuate due to the fluctuation of the manufacturing process conditions, etc.

Therefore, considering the fluctuation of the thickness dimension of the inter-gate insulating film 4, etc., the programming characteristics can be reliably improved when $0.25 \leq T1/T2 \leq 0.85$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
    a plurality of memory cells, each of the memory cells including
        a tunneling insulating film provided on a substrate including silicon,
        a floating gate provided on the tunneling insulating film,
        an inter-gate insulating film provided on the floating gate, and
        a control gate provided on the inter-gate insulating film; and
    an element separation trench provided between the plurality of memory cells, the element separation trench having a gap in an interior of the element separation trench,
    the inter-gate insulating film being provided also above the gap, and the inter-gate insulating film having a recess in the gap side,
    an upper end of the gap being provided in an interior of the recess.

2. The device according to claim 1, wherein a thickness of the inter-gate insulating film above the gap is thinner than a thickness of the inter-gate insulating film above the floating gate.

3. The device according to claim 1, wherein the following formula $0 < T1/T2 < 1$ is satisfied, where T1 is a thickness dimension of the inter-gate insulating film above the gap, and T2 is a thickness dimension of the inter-gate insulating film above the floating gate.

4. The device according to claim 1, wherein the following formula $0.25 \leq T1/T2 \leq 0.85$ is satisfied, where T1 is a thickness dimension of the inter-gate insulating film above the gap, and T2 is a thickness dimension of the inter-gate insulating film above the floating gate.

5. The device according to claim 1, wherein the following formula $T1/T2 = 0.75$ is satisfied, where T1 is a thickness dimension of the inter-gate insulating film above the gap, and T2 is a thickness dimension of the inter-gate insulating film above the floating gate.

6. The device according to claim 1, wherein a position of a lower end of the gap is lower than a position of a lower end of the floating gate.

7. The device according to claim 1, further comprising an element-separating insulating film provided in the interior of the element separation trench below the gap.

8. The device according to claim 1, wherein the inter-gate insulating film includes at least one type selected from the group consisting of a silicon oxide film, a silicon oxynitride film, and a silicon oxide film/silicon nitride film/silicon oxide film (ONO film).

9. The device according to claim 1, wherein a thickness dimension of the inter-gate insulating film is not less than 5 nm and not more than 30 nm.

10. The device according to claim 1, wherein the inter-gate insulating film is provided at an upper surface of the floating gate and a side surface of the floating gate.

11. The device according to claim 1, wherein air exists in an interior of the gap.

12. The device according to claim 1, wherein the gap is provided continuously along the element separation trench.

13. The device according to claim 1, wherein the gap does not pierce the inter-gate insulating film.

14. The device according to claim 7, wherein the gap is made by removing a portion of the element-separating insulating film.

15. The device according to claim 7, further comprising a protective film provided at an inner wall of the element separation trench,
    the protective film including an insulator,
    a purity of the insulator included in the protective film being higher than a purity of the insulator included in the element-separating insulating film.

16. The device according to claim 7, wherein the element-separating insulating film includes silicon oxide.

17. The device according to claim 1, wherein the tunneling insulating film includes at least one selected from silicon oxide and silicon oxynitride.

18. The device according to claim 1, wherein the floating gate includes polysilicon.

19. The device according to claim 1, wherein the control gate includes polysilicon.

20. The device according to claim 1, wherein the nonvolatile semiconductor memory device is NAND flash memory.

* * * * *